United States Patent
Bakalski et al.

(10) Patent No.: US 9,515,645 B2
(45) Date of Patent: Dec. 6, 2016

(54) SYSTEM AND METHOD FOR A RADIO FREQUENCY SWITCH

(71) Applicant: Infineon Technologies AG, Neubiberg (DE)

(72) Inventors: Winfried Bakalski, Munich (DE); Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/294,757

(22) Filed: Jun. 3, 2014

(65) Prior Publication Data

US 2015/0349770 A1    Dec. 3, 2015

(51) Int. Cl.
| H04B 1/44 | (2006.01) |
| H03K 17/16 | (2006.01) |
| H03K 3/012 | (2006.01) |
| H04B 1/00 | (2006.01) |
| H04B 1/04 | (2006.01) |
| H04B 1/18 | (2006.01) |

(52) U.S. Cl.
CPC .............. *H03K 17/16* (2013.01); *H03K 3/012* (2013.01); *H04B 1/006* (2013.01); *H04B 1/0458* (2013.01); *H04B 1/18* (2013.01); *H04B 1/44* (2013.01)

(58) Field of Classification Search
CPC ............. H04B 1/44; H04B 1/48; H04B 15/02; H04B 1/0057; H04B 1/006; H04B 1/0458; H04B 1/18; H03H 7/40; H03H 7/465; H03K 17/16; H03K 17/693; H03K 3/012

USPC ........................................................ 455/426
See application file for complete search history.

(56) References Cited

U.S. PATENT DOCUMENTS

| 6,256,495 | B1 * | 7/2001 | Francisco | H03K 17/76 333/103 |
| 8,008,988 | B1 * | 8/2011 | Yang | H03K 17/693 333/101 |
| 2009/0153417 | A1 | 6/2009 | Chen | |
| 2011/0092179 | A1 * | 4/2011 | Burgener | H01P 1/15 455/333 |
| 2011/0221510 | A1 * | 9/2011 | Botula | H01L 21/76224 327/534 |
| 2012/0146698 | A1 * | 6/2012 | Caron | H04B 1/48 327/231 |
| 2012/0188007 | A1 * | 7/2012 | Van Zyl | H01J 37/32183 327/574 |
| 2013/0069708 | A1 | 3/2013 | Koya et al. | |
| 2013/0072134 | A1 | 3/2013 | Goto et al. | |
| 2013/0203367 | A1 | 8/2013 | Mui et al. | |
| 2013/0321061 | A1 * | 12/2013 | Chen | H03K 17/16 327/382 |

(Continued)

*Primary Examiner* — Edward Urban
*Assistant Examiner* — Max Mathew
(74) *Attorney, Agent, or Firm* — Slater Matsil, LLP (57) ABSTRACT

In accordance with an embodiment, a circuit includes a plurality of switching networks coupled between a corresponding plurality of RF ports and a common RF port, and a control circuit. Each of the plurality of switching networks includes a first switch coupled between its corresponding RF port and the common RF port, and at least one of the plurality of switching networks includes a selectable network coupled between the first switch and the common RF port, such that the selectable network provides a DC path in a first state and a series capacitance in a second state.

15 Claims, 4 Drawing Sheets

(56) References Cited

U.S. PATENT DOCUMENTS

| | | | | |
|---|---|---|---|---|
| 2014/0009213 A1* | 1/2014 | Sprinkle | ............... | H03K 17/161 327/427 |
| 2014/0009214 A1* | 1/2014 | Altunkilic | ............ | H03K 17/161 327/427 |
| 2014/0035631 A1* | 2/2014 | Choi | ...................... | H03K 3/012 327/111 |
| 2014/0227982 A1* | 8/2014 | Granger-Jones | ..... | H04B 7/0404 455/77 |
| 2014/0340137 A1* | 11/2014 | Keane | ................ | H03K 17/6872 327/434 |
| 2015/0256147 A1* | 9/2015 | Na | ...................... | H03K 17/693 307/115 |
| 2015/0311922 A1* | 10/2015 | Bakalski | ................ | H04B 1/006 455/552.1 |

* cited by examiner

FIG. 1

PRIOR ART

SYSTEM AND METHOD FOR A RADIO FREQUENCY SWITCH

TECHNICAL FIELD

The present disclosure relates generally to an electronic device, and more particularly to a system and method for a radio frequency (RF) switch.

BACKGROUND

RF switches are used in a variety of RF circuits to implement various functions. For instance, an RF system using different signaling methods over different frequencies may be implemented by using a network of antenna switches to select from between different types of RF front-end circuits. One example of such a circuit is a multi-standard cellular telephone that can make calls using different standards such as code division multiple access (CDMA) or Global System for Mobile Communications (GSM). By using an RF switch, an RF front end circuit optimized for CDMA communication may be used for CDMA calls, while an RF front-end circuit optimized for GSM communication may be used for GSM calls. In addition, RF switches may be used to implement adjustable matching networks for antennas and power amplifiers, and to provide adjusting tuning for high frequency filters by switching in and out and/or bypassing passive matching and tuning elements.

One of the key measures of performance of an RF switch is linearity, which is commonly expressed, for example, in terms of harmonic distortion and/or intermodulation distortion. In multi-band systems that both transmit and receive, appreciable distortion may degrade the performance of the RF system. For example, the harmonic or intermodulation distortion of a transmitted signal may fall in the same band of a received signal and interfere with the received signal. As such, RF switches are often specified to have very low distortion. As RF switches become more integrated and implemented on fine geometry processes, it becomes more challenging to meet high linearity performance.

SUMMARY OF THE INVENTION

In accordance with an embodiment, a circuit includes a plurality of switching networks coupled between a corresponding plurality of RF ports and a common RF port, and a control circuit. Each of the plurality of switching networks includes a first switch coupled between its corresponding RF port and the common RF port, and at least one of the plurality of switching networks includes a selectable network coupled between the first switch and the common RF port, such that the selectable network provides a DC path in a first state and a series capacitance in a second state.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context: a system and method for a radio frequency (RF) switch. The invention may also be applied to other systems and applications including other circuits that utilize switches for high frequency applications such as wireless and wireline communication systems, radar systems, and in circuits such as oscillators, receive/transmit switches, attenuators, power amplifier bypass circuits, RF matching and RF filter switching in general.

In embodiments of the present invention, a multi-port switch is implemented using a plurality of series RF switches coupled between respective ports and a common port. At least one of these series RF switches is coupled in series with a series circuit that either functions as a series capacitance or as a closed switch. In situations where the series RF switch is open, configuring the series circuit as a closed switch couples a parasitic capacitance to the common port that is on the order of the parasitic capacitance of the closed switch. On the other hand, configuring the series circuit as a series capacitance couples a parasitic capacitance that is on the order of a series combination of the parasitic capacitance of the RF switch and the capacitance of the series capacitor. This series combination of capacitance is generally lower than each capacitance individually. In some embodiments, the series circuit is set to have a series capacitance when its corresponding RF switch is off in order to present a low parasitic capacitance at the common node. This setting may be used, for example, when a high frequency band is introduced at the selected port of the RF switch in order to minimize attenuation. On the other hand, the series circuit may be set to have a low impedance in order to load the common node with the parasitic capacitance of the open RF switch in order to attenuate harmonics of a lower frequency introduced a the selected port of the RF switch. In some embodiments, multiple series RF switches may have an associated series circuit associated with it to provide further attenuation and/or flexibility with respect to how much attenuation is applied to the harmonics of a particular signal.

Figure 1:
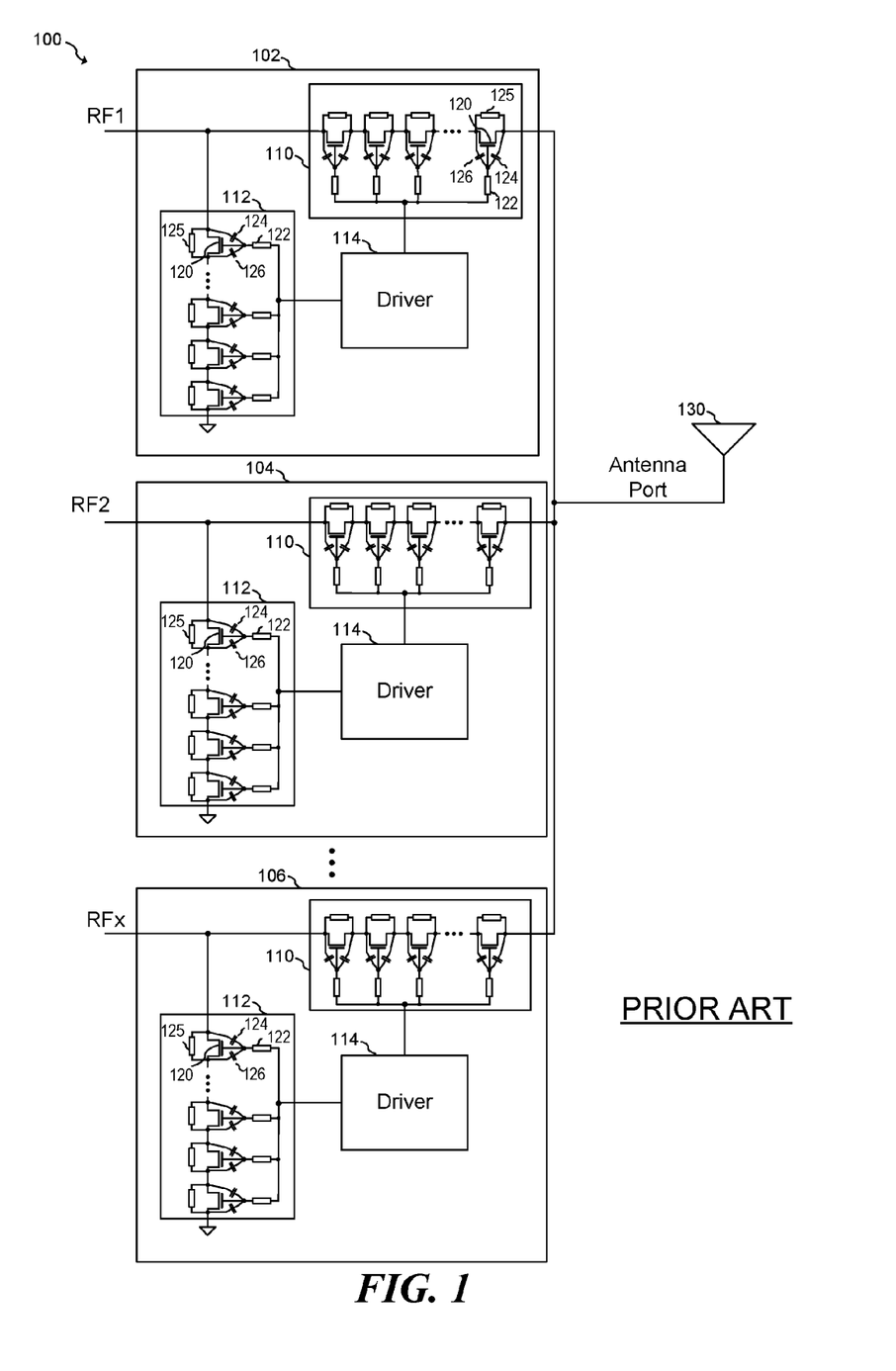
FIG. 1 illustrates a conventional RF switch system.

FIG. 1 illustrates conventional RF system 100 in which RF switching network 102, 104 and 106 are used to select and route one of ports RF1, RF2 to RFx to antenna 130. As shown, each RF switching network includes a series RF switch 110, a shunt RF switch 112 and a switch driver 114. During operation, a selected RF path is formed when driver 114 turns on series RF switch 110 and turns off shunt RF switch 112. Likewise, a RF path is deselected by turning off series RF switch 110 and turning on shunt RF switch 112.

Each RF switch 110 and 112 is implemented using a number of transistors 120 connected in series with each other. The source and drain of each transistor 120 is biased using resistor 125, and the gate is each transistor 120 has a series gate resistor 122. When gate resistors 122 have an impedance that is sufficiently greater than the capacitive impedances of gate drain capacitance 124 and gate source capacitance 126, the parasitic overlap capacitances are symmetrically spread over all transistors 120 when transistors 120 are shut off. Thus, the capacitance between the terminals of each of RF switches 110 and 112 is approximately the series combination of gate drain capacitances 124 and gate source capacitances 126.

As shown, transistors 120 are stacked in order to withstand high voltages. For example, for a 1.5 V semiconductor process in order to operate under a 24 V peak voltage, such as seen in a typical GSM transmitter, 16 transistors are stacked. The number of stacked transistors may vary according to the particular semiconductor technology used and the expected operating environment.

Assuming that resistor 125 has a high ohmic value, the overall parasitic OFF-capacitance for RF switches 110 and 112 may be expressed as:

$$C_{off} = \frac{WC_{gs}}{2N} * THROWCOUNT,$$

where W is the transistor width, Cgs the gate/source and gate/drain overlap capacitance, and N is the number of transistors coupled in series. THROWCOUNT is defined as the number of transistors on the embodiment switch. As can be seen by the equation above, the overall parasitic OFF-capacitance $C_{off}$ increases as N is reduced and decreases as N is increased. In some cases, the number of transistors N is a function of the expected voltage. As the number of series transistors increase, however, there is a corresponding increase in the on resistance $R_{on}$ of the switch. As such, RF switching networks are often designed using the particular $R_{on}$*Coff tradeoff of the particular technology, as the specification of Ron and $C_{off}$ often conflicts with each other when a low on resistance $R_{on}$ and low off capacitance $C_{off}$ is needed. Thus, when low insertion loss is needed, the increased width of the transistor used to achieve a lower resistance causes a corresponding increase in parasitic capacitance, which, in turn, causes higher insertion losses in the higher bands.

Figure 2:
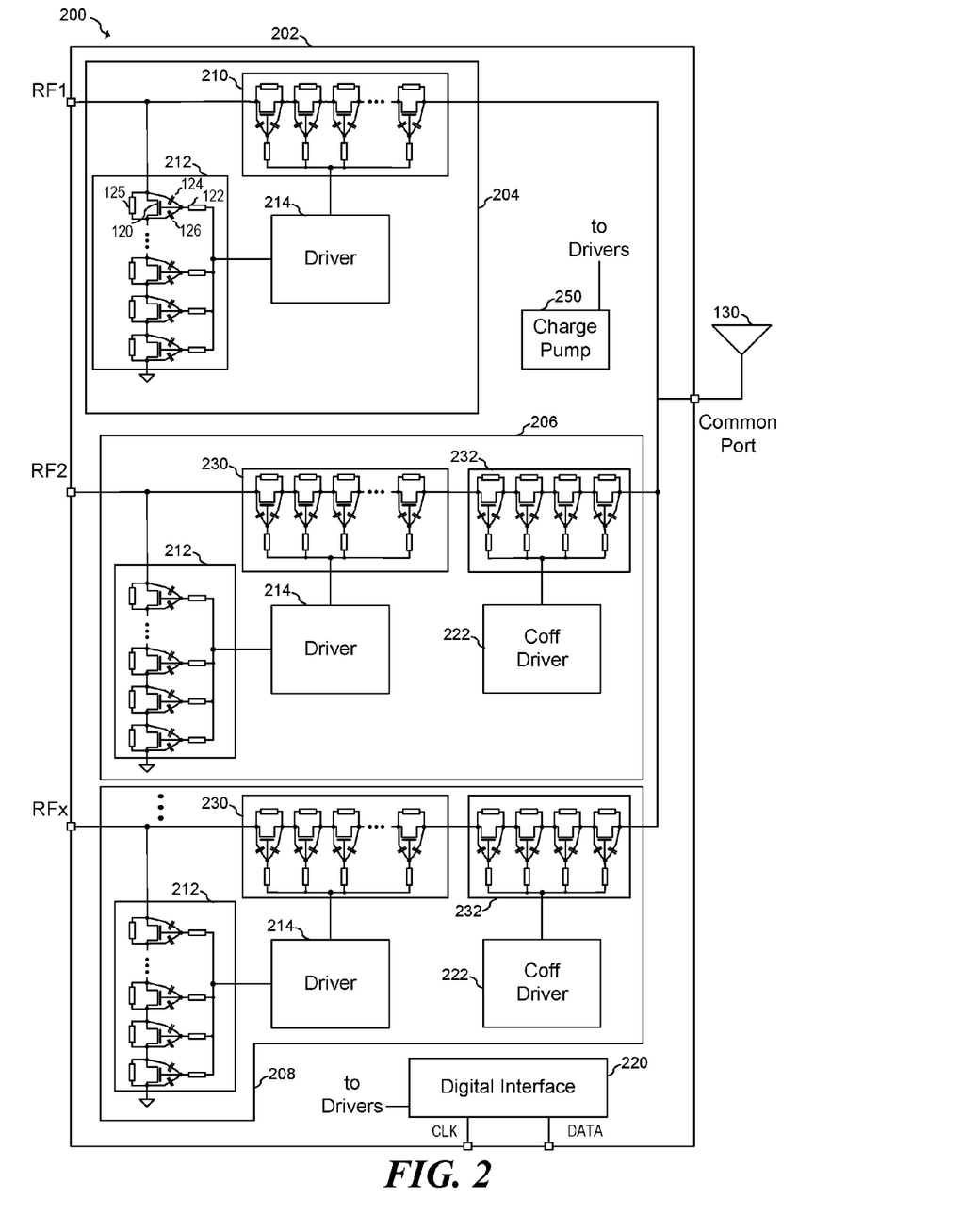
FIG. 2 illustrates an embodiment RF switch system.

FIG. 2 illustrates an embodiment system 200 in which the parasitic capacitance coupled to the common port is selectively adjustable based. For example, in situations in which a large, lower frequency signal is being handed by RF switches, the extra capacitance may be used to attenuate harmonics. On the other hand, when higher frequency signals are being handled by the RF switches, less capacitance may be applied.

Embodiment system 200 includes a RF switching integrated circuit (IC) having RF switching networks 204, 208 and 210 that select from among ports RF1 and RF2-RFx. Only three RF switching networks are shown for simplicity of illustration, however, any number of switches may be used. As shown, switching network 204 includes series switch 210 and shunt switch 212, which may include stacked transistors 120 as described above with respect to FIG. 1. As shown, transistor 120 is implemented using an NMOS device, however, transistor 120 may be implemented using a PMOS device, or other transistor type in a CMOS-Bulk, CMOS-SOI using think or thick film silicon on insulator (SOI), GaAs-HEMTs, or other FET transistor type technology. In some cases, PIN Diodes may also be used. Driver 214 is used to turn switches 210 and 212 on and off. In one embodiment, driver 214 drives the gates of transistors 120 with an on voltage of 1.5 V to turn the switches 210 and 212 on, and drives the gates of transistors with an off voltage of −1.5 V to turn switches 210 and 212 off. This negative voltage may be generated off-chip using a power supply or on-chip using a circuit such as charge pump 250 or other type of voltage generation circuit. It should be appreciated that in alternative embodiments of the present invention, other driving voltages besides −1.5 V and 1.5 V may be used depending on the particular system and its specifications and depending on the particular technology used to implement RFIC 202.

In an embodiment, RF switching networks 206 and 208 includes shunt RF switch 212 and series RF switches 230 and 232. In an embodiment, the combined number of series transistors in series RF switches 230 and 232 is equal to the number of switches in series RF switch 210 within switching network 204. During operation, when switching network 206 or 208 are configured to connect node RF2 to RFx, shunt switch 212 is turned off and series RF switches 230 and 232 are turned on. On the other hand, when switching network 206 and/or switching network 208 are configured to disconnect nodes RF2 and/or RFx from the common port, shunt switch 212 is turned on and series RF switch 230 is turned off. Series RF switch 232 may be either turned on or turned off. When RF switch 232 is turned on to create a low impedance path from the common node to series RF switch 230, the common node is loaded with the parasitic capacitance of series RF switch 230 coupled to ground due to the gate drain capacitances 124 and gate source capacitances 126. On the other hand, when RF switch 232 is turned off, the common port is loaded with the series combination of parasitic capacitances of series RF switches 230 and 232. Accordingly, the off capacitance of switches 206 and 208 are higher when series RF switch 232 is on than when series RF switch 232 is off. In an embodiment, switch 232 is driven by Coff driver 222. Both drivers 214 and Coff driver 222 may be implemented using switch driver circuits and methods known in the art. In some embodiment, both drivers 214 and 222 may be implemented using the same or a similar circuit topology. Similarly, series RF switches 230 and 232 may share a same topology.

In some embodiments, RF switching network 204 may also be implemented using two series RF switches, such as done with respect to RF switching networks 206 and 208. In other embodiments, some RF switches implemented on RFIC 202 may be implemented using a single RF switch, such as in switching network 204, while other RF switches may be implemented using two or more series RF switches such as is done with respect to RF switching networks 206 and 208.

In an embodiment, the decision to activate or deactivate series RF switches 232 when adjoining series RF switch 230 is turned off is made depending on the particular situation. For example, when a high power GSM signal at about 824 MHz having an output power of about 35 dBm is introduced at port RF1, RF switches 232 may be turned off in RF switching networks 206 and 208 in order to increase the series transistor count to withstand the high signal level. In some embodiments, the GSM signal path may have a pre-filter to attenuate power in adjacent channels.

In another scenario, when a lower power 3G or LTE signal between about 27 dBm and about 30 dBm and having a frequency of between about 700 MHz and about 900 MHz is introduced at port RF1, driver 222 may turn series RF switch 232 on to increase the parasitic capacitance seen at the common port. The more RF switching networks that have is respective series RF switch 232 activated, the greater the parasitic capacitance of seen at the common port. This parasitic capacitance may be used to attenuate the harmonics of the signal at port RF1. Since the power applied to RF1 is lower than the GSM case, in this example, not as many transistors 120 need to be stacked to withstand the signal level. In one embodiment, the second harmonic of the 700 MHz signal is attenuated by between about 3 dB and about 4 dB, while the third harmonic is attenuated by about 10 dB.

In situations where high frequency signals are introduced, for example, between about 1.5 GHz and 3 GHz, series RF switch 232 may be turned off when adjoining series RF switch 230 is turned off in order to reduce the attenuation of the high frequency signal. It should be understood that in alternative embodiments, other frequencies, signal levels, signal types and harmonic attenuation may be achieved depending on the particular embodiment and its specifications.

In an embodiment, the state of RF switching networks 204, 206 and 208 may be controlled using digital interface 220, which may be a serial interface, such as a SPI interface, I2C interface, MIPI/RFFE or other serial interface known in the art. In alternative embodiments of the present invention, digital interface 220 may also be implemented using a parallel interface. Digital interface 220 is coupled to pins CLK and DATA to receive and/or transmit a clock and data. Other digital interface pins may also be used according to the particular interface standard.

Figure 3:
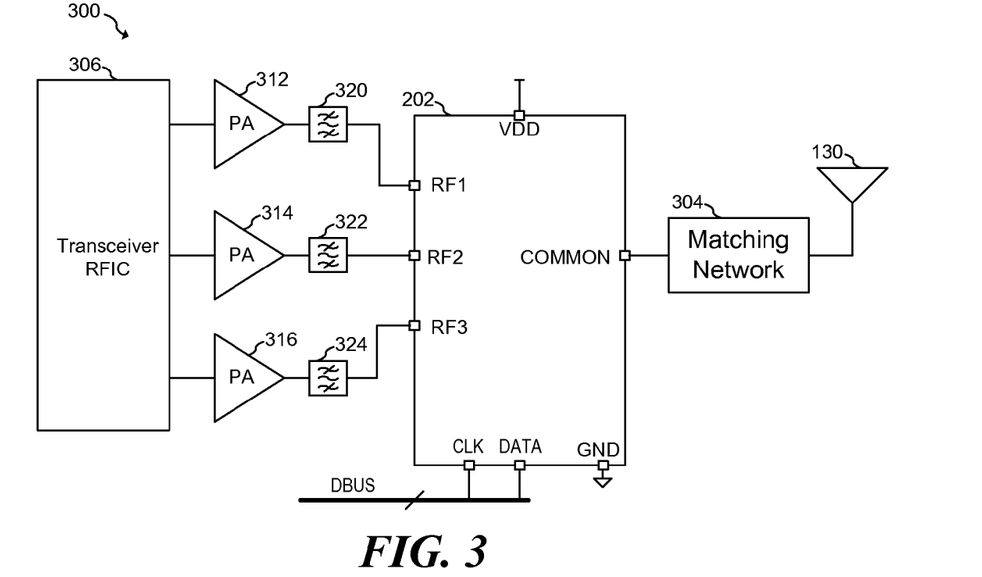
FIG. 3 illustrates an embodiment RF system.

FIG. 3 illustrates RF system 300 according to an embodiment of the invention that includes embodiment RFIC described above with respect to FIG. 2 coupled to transceiver RF IC 306 via power amplifiers (PAs) 312, 314 and 316 and respective filters 320, 322 and 324. Transceiver RF IC 306 may provide the front end and signal processing circuitry that implements one or more RF communication standards, and PAs 312, 314 and 316 may be used to amplify the output of transceiver RFIC 306, and filters 320, 322 and 324 may be used to filter the output of PAs 312, 314 and 316. In alternative embodiments, one or more of filters 320, 322 and 324, as well as PAs 312, 314 and 316 may be omitted depending on the particular system and its specifications. Moreover, in alternative embodiments, greater or fewer than three ports RF1, RF2 and RF3 may be implemented. Optional matching network 304 coupled the common port of RFIC 202 provides an impedance match between RFIC 202 and antenna 130. Settings for RFIC 202 may be read and written via digital bus DBUS via terminals CLK and DATA. It should be appreciated that RF system 300 shown in FIG. 3 is just one of many embodiments systems that may be used with embodiment switches described herein.

Figure 4:
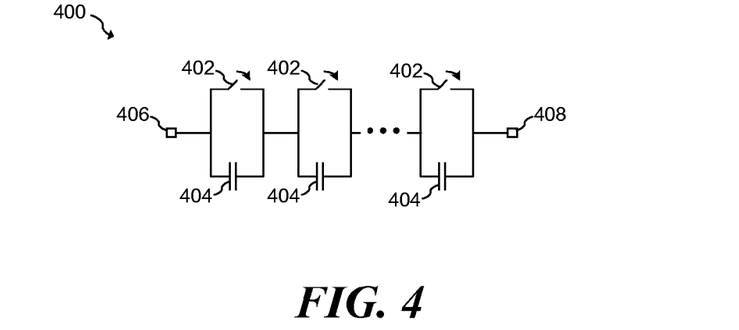
FIG. 4 illustrates an embodiment selectable capacitance network.

FIG. 4 illustrates an embodiment selectable capacitance network 400 that may be used in place of series RF switches 232 shown in FIG. 3. Switchable capacitance network 400 includes one or more series capacitors 404 coupled between terminals 406 and 408. Each of the capacitors 404 may by bypassed by a corresponding switch 402. During operation, switches 402 are closed when a corresponding RF signal path is activated or when a higher capacitive load is coupled to the common node. On the other hand, switches 402 are opened when a lower capacitive load is coupled to the common node. In an embodiment, switches 402 may be implemented using switching transistors such as NMOS, PMOS or bipolar devices. Switches 402 may also be implemented using diodes or other switching devices known in the art. Capacitors 404 may be implemented using various known capacitance structures including, but not limited to, metal-insulator-metal (MIM) capacitors, gate capacitors, polysilicon capacitors, or a combination thereof. In some embodiments, the number of series capacitors and the size of each of the series capacitors may be determined in order to evenly distribute signal power across the various capacitors within selectable capacitance network 400 and among the series switching transistors of adjacent series RF switches such as switches 230 shown in FIG. 3.

Figure 5:
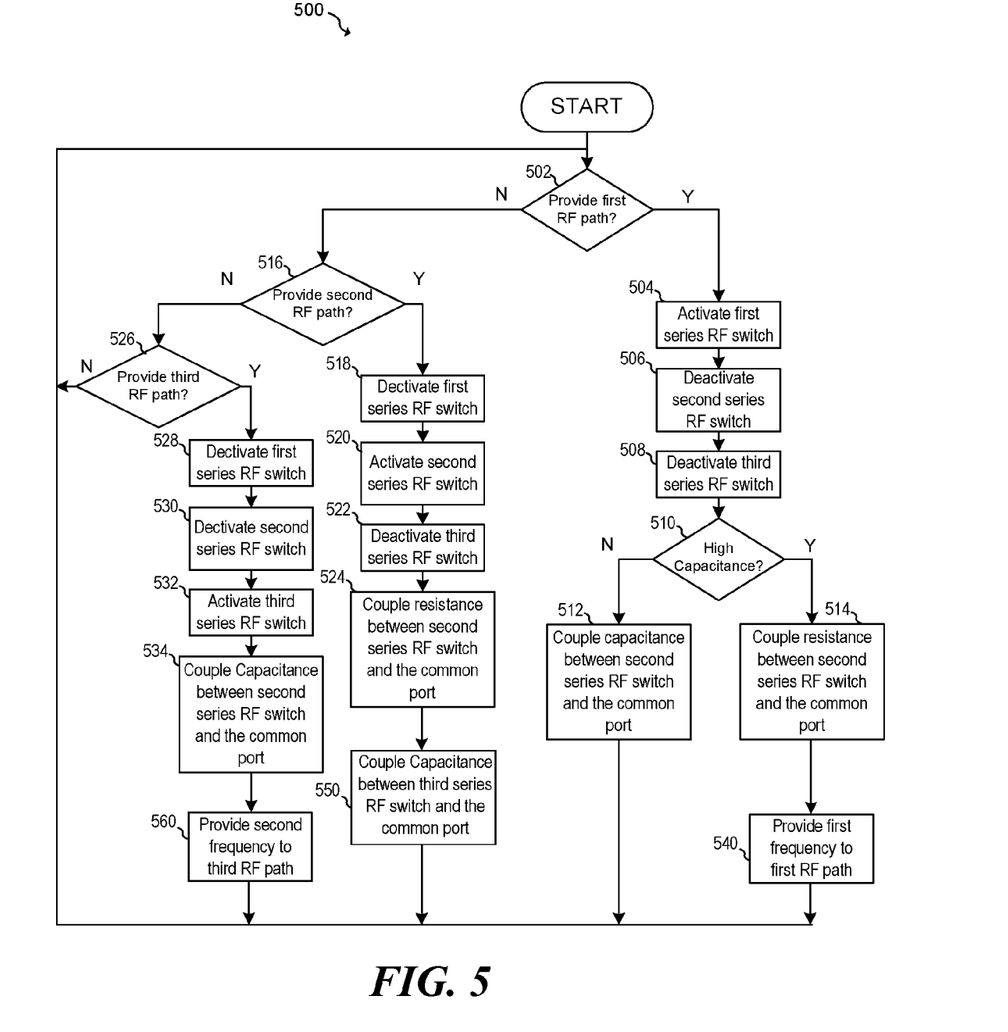
FIG. 5 illustrates a flowchart of an embodiment method.

FIG. 5 illustrates a flowchart of an embodiment method 500 according to an embodiment of the present invention. In an embodiment method 500 is directed toward a method of operating a circuit that includes a first series RF switch coupled between a first port and a common port, a second series RF switch coupled between a second port and a first node, and a third series RF switch coupled between a third port and the common port. In step 502, the method determines whether to provide a first RF path between the first port and the common port. If it is determined to provide the first RF path, the first RF switch is activated in step 504, the second RF switch is deactivated in step 506 and the third RF switch is deactivated in step 508.

The method further determines whether or not to couple a higher capacitance to the common node in step 510. Factors that may weigh in such a determination include, but are not limited to, the power of the RF signal being delivered through the RF switching system, the frequency of the RF signal, the particular frequency plan, and the necessity of attenuating harmonics. If a higher capacitance is chosen, a resistance is coupled between the second series RF switch and the common port in step 514. In some cases, a first frequency may then be provided to the first RF path in step 540. If a higher capacitance is not chosen, a capacitance is coupled between the second series RF switch and the common port in step 512. Such a capacitance and resistance may be implemented, for example, by using an RF switch having a plurality of series transistors such as series RF switch 232 shown in FIG. 3, by using a switchable capacitance network such as selectable capacitance network 400 shown in FIG. 4. Alternatively, other circuits and methods may be used to implement the steps 512 and 514.

In step 516, the method determines whether to provide a second RF path between the second port and the common port. If it is determined to provide the second RF path, the first RF switch is deactivated in step 518, the second RF switch is activated in step 520, the third RF switch is deactivated in step 522, and the resistance is coupled between the second series RF switch and the common port in step 524. In some cases, a further capacitance may be coupled between the third series RF switch and the common port in step 550. On the other hand, in step 526, the method determines whether to provide a third RF path between the third port and the common port. If it is determined to provide the third RF path, the first RF switch is deactivated in step 528, the second RF switch is deactivated in step 530, the third RF switch is activated in step 532, and the capacitance is coupled between the second series RF switch and the common port in step 534. In some cases, a second frequency may then be provided to the third RF path in step 560. In some cases, the second frequency in step 560 is greater than the first frequency described above with respect to step 540.

In accordance with an embodiment, a circuit includes a plurality of switching networks coupled between a corresponding plurality of RF ports and a common RF port, and a control circuit. Each of the plurality of switching networks includes a first switch coupled between its corresponding RF port and the common RF port, and at least one of the plurality of switching networks includes a selectable network coupled between the first switch and the common RF port, such that the selectable network provides a DC path in a first state and a series capacitance in a second state. The control circuit configured to establish an RF path by activating the first switch of one of the plurality of switching networks, and deactivating the first switches of the remaining plurality of switching networks, and placing the selectable network in one of the remaining plurality of switching networks in the first state when the control circuit operates in a first mode, and placing the selectable network in one of the remaining plurality of switching networks in the second state when the control circuit operates in a second mode. In some embodiments, the plurality of switching networks is disposed on an integrated circuit.

In an embodiment, the first switch includes a first plurality of series connected transistors. The selectable network may include a second plurality of series connected transistors. Furthermore, the selectable network is in the first state when the second plurality of series connected transistors are turned on, and is in the second state when the second plurality of series connected transistors are turned off.

In an embodiment, the series capacitance includes gate-drain and gate-source capacitances of the second plurality of series connected transistors. In other embodiments, the selectable network includes a capacitor coupled in parallel with a switch.

In an embodiment, the selectable network in series with the first switch in a first switching network is configured to attenuate a third harmonic of a signal propagated in a second switching network in the first mode. The selectable network may further include a shunt switch coupled between the corresponding RF port and a reference node.

In an embodiment, the circuit further includes an antenna coupled to the common RF port, and a power amplifier coupled to at least one of the plurality of RF ports. A matching network may be further coupled between the common RF port and the antenna.

In accordance with a further embodiment, method of operating a circuit includes providing a first RF path from a first port to a common port by activating a first series RF switch coupled between the first port and the common port, deactivating a second series RF switch coupled between a second port and a first node, deactivating a third series RF switch coupled between a third port and the common port, and coupling a resistance between the first node and the common port. The method further includes providing a second RF path from the second port to the common port by activating the second series RF switch, deactivating the first RF switch and the third RF switch, and coupling the resistance between the first node and the common port, and providing a third RF path from the second port to the common port by activating the third series RF switch, deactivating the first series RF switch and the second series RF switch, and coupling a capacitance between the first node and the common port.

In an embodiment, activating the first series RF switch includes activating a first plurality of series connected transistors, activating the second series RF switch comprises activating a second plurality of series connected transistors, and activating the third series RF switch comprises activating a third plurality of series connected transistors. In an embodiment, coupling the capacitance between the first node and the common port includes deactivating a fourth plurality of series connected transistors coupled between the first node and the common port, and coupling the resistance between the first node and the common port includes activating the fourth plurality of series connected transistors. Alternatively, coupling the capacitance between the first node and the common port comprises turning off a bypass switch coupled in parallel with a capacitor coupled between the first node and the common port, and coupling the resistance between the first node and the common port comprises turning on the bypass switch.

In an embodiment, providing the first RF path further includes coupling a further resistance between third series RF switch and the common port, providing the second RF path further includes coupling a further capacitance between third series RF switch and the common port, and providing the third RF path further comprises coupling the further resistance between third series RF switch and the common port.

The method may further include providing a first frequency to the first RF path, and providing a second frequency to the third RF path, wherein the second frequency is greater than the first frequency. In an embodiment, providing the first RF path further includes attenuating a harmonic of the first frequency using a series combination of the capacitance and a parasitic capacitance of the second series RF switch. The method may further include providing a low capacitance first RF path from the first port to the common port by activating the first series RF switch, deactivating the second RF switch and the third RF switch, and coupling the capacitance between the first node and the common port.

In accordance with a further embodiment, a circuit includes a plurality of RF switching networks coupled between a corresponding plurality of RF ports and a common port, such that each of the plurality of RF switching networks include a first switching portion coupled between a corresponding RF port and the common port, and a second switching portion coupled between the first switching portion and the common port. The circuit also includes a control circuit configured to establish a RF path from one of the plurality of RF ports to the common port by activating a corresponding first switching portion and second switching portion of one of the plurality of RF switching networks and deactivate the first switching portion of a remaining plurality of RF switching networks. In a first mode, the control circuit deactivates the second switching portions of the remaining plurality of RF switching networks, and in a second mode, the control circuit activates the second switching portions of at least one of the remaining plurality of RF switching networks.

The first switching portion may include a first plurality of series connected transistors, and the second switching portion may include a second plurality of series connected transistors. In an embodiment, the second mode is configured to attenuate harmonics of an RF signal by capacitively loading the common port with a parasitic capacitance of the first switching portions of the remaining plurality of RF switching networks.

In an embodiment, the circuit further includes an antenna coupled to the common port, and a power amplifier coupled to at least one of the plurality of RF ports.

In accordance with a further embodiment, a circuit includes a first series RF switch coupled between a first port and a common port, a second series RF switch coupled between a second port and a first node, a third series RF switch coupled between a third port and the common port, and a switched series capacitance circuit coupled between the first node and the common port, wherein the switched series capacitance circuit is configured to be a capacitor in a capacitive state and to be a resistor in a resistive state. The circuit also includes a control circuit configured to provide a first RF path from the first port to the common port by activating the first series RF switch, deactivating the second series RF switch, deactivating the third series RF switch, and placing the switched series capacitance circuit in the resistive state. The control circuit further provides a second RF path from the second port to the common port by activating the second series RF switch, deactivating the first series RF switch, deactivating the third RF switch and placing the switched series capacitance circuit in the resistive state. A third RF path from the third port to the common port is also provided by the control circuit by activating the third series RF switch, deactivating the first series RF switch, deactivating the second RF switch and placing the switched series capacitance circuit in the capacitive state. The first series RF switch, the second series RF switch, the third series RF switch and the switched series capacitance circuit may be disposed on an integrated circuit. The circuit may further include a further series RF switch coupled between a further port and the common node.

In an embodiment, the first series RF switch includes a first plurality of series connected transistors, the second series RF switch comprises a second plurality of series connected transistors, and the third RF switch includes a third plurality of series connected transistors. The switched series capacitance circuit may include a fourth plurality of series connected transistors, the switched series capacitance is in the capacitive state when the fourth plurality of series connected transistors are turned off, and the switched series capacitance is in the resistive state when the fourth plurality of series connected transistors are turned on.

In an embodiment, a capacitance of the switched series capacitance includes gate-drain and gate-source capacitances of the fourth plurality of switching transistors. In an embodiment, the first plurality of transistors is greater than the second plurality of transistors. The switched series capacitance circuit may include a capacitor coupled in parallel with a switch.

In an embodiment, the switched series capacitance circuit and the second series RF switch are configured to attenuate a third harmonic of a signal propagated by the first RF path when the first RF path is active. The circuit may further include a first shunt RF switch coupled between the first port and a reference node, a second shunt RF switch coupled between the second port and the reference node, and a third shunt RF switch coupled between the third port and the reference node. In some embodiment, the circuit further includes a further switched series capacitance circuit coupled between the third RF switch and the common port.

In an embodiment, the control circuit is further configured to place the further switched series capacitance circuit in the resistive state when providing the first RF path and when providing the third RF path, and place the further switched series capacitance circuit in the capacitive state when providing the second RF path.

Advantages of some embodiments include the ability to achieve high linearity in a RF switching system without using extra filtering components. A further advantage includes allowing an RF switch to trade-off between high voltage breakdown performance and filtering. Further advantages include a capacitive prematch for inductive loads such as those found in detuned antennas.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a circuit comprising a first series RF switch coupled between a first port and a common port, a second series RF switch coupled between a second port and a first node, and a third series RF switch coupled between a third port and the common port, the method comprising:

providing a first RF path from a first port to a common port by activating the first series RF switch, deactivating the second series RF switch and the third series RF switch, and coupling a resistance between the first node and the common port, wherein activating the first series RF switch comprises activating a first plurality of series connected transistors;

providing a second RF path from the second port to the common port by activating the second series RF switch, deactivating the first series RF switch and the third series RF switch, and coupling the resistance between the first node and the common port, wherein activating the second series RF switch comprises activating a second plurality of series connected transistors; and providing a third RF path from the second port to the common port by activating the third series RF switch, deactivating the first series RF switch and the second series RF switch, and coupling a capacitance between the first node and the common port, wherein activating the third series RF switch comprises activating a third plurality of series connected transistors.

2. The method of claim 1, wherein:
coupling the capacitance between the first node and the common port comprises deactivating a fourth plurality of series connected transistors coupled between the first node and the common port; and
coupling the resistance between the first node and the common port comprises activating the fourth plurality of series connected transistors.

3. The method of claim 1, wherein:
coupling the capacitance between the first node and the common port comprises turning off a bypass switch coupled in parallel with a capacitor coupled between the first node and the common port; and
coupling the resistance between the first node and the common port comprises turning on the bypass switch.

4. The method of claim 1, wherein
providing the first RF path further comprises coupling a further resistance between third series RF switch and the common port;
providing the second RF path further comprises coupling a further capacitance between third series RF switch and the common port; and
providing the third RF path further comprises coupling the further resistance between third series RF switch and the common port.

5. The method of claim 1, further comprising:
providing a first frequency to the first RF path; and
providing a second frequency to the third RF path, wherein the second frequency is greater than the first frequency.

6. The method of claim 5, wherein providing the first RF path further comprises attenuating a harmonic of the first frequency using a series combination of the capacitance and a parasitic capacitance of the second series RF switch.

7. The method of claim 1, further comprising providing a low capacitance first RF path from the first port to the common port by activating the first series RF switch, deactivating the second RF switch and the third RF switch, and coupling the capacitance between the first node and the common port.

8. A circuit comprising:
a first series RF switch coupled between a first port and a common port; a second series RF switch coupled between a second port and a first node; a third series RF switch coupled between a third port and the common port; a switched series capacitance circuit coupled between the first node and the common port, wherein the switched series capacitance circuit is configured to be a capacitor in a capacitive state and to be a resistor in a resistive state; and
a control circuit configured to:
provide a first RF path from the first port to the common port by activating the first series RF switch, deactivating the second series RF switch, deactivating the third series RF switch, and placing the switched series capacitance circuit in the resistive state, wherein activating the first series RF switch comprises activating a first plurality of series connected transistors,
provide a second RF path from the second port to the common port by activating the second series RF switch, deactivating the first series RF switch, deactivating the third RF
switch and placing the switched series capacitance circuit in the resistive state, wherein activating the second series RF switch comprises activating a second plurality of series connected transistors, and
provide a third RF path from the third port to the common port by activating the third series RF switch, deactivating the first series RF switch, deactivating the second RF switch and placing the switched series capacitance circuit in the capacitive state, wherein activating the third series RF switch comprises activating a third plurality of series connected transistors.

9. The circuit of claim 8, wherein
the first series RF switch comprises the first plurality of series connected transistors;
the second series RF switch comprises the second plurality of series connected transistors; and
the third RF switch comprises the third plurality of series connected transistors.

10. The circuit of claim 9, wherein:
the switched series capacitance circuit comprises a fourth plurality of series connected transistors;
the switched series capacitance is in the capacitive state when the fourth plurality of series connected transistors are turned off; and
the switched series capacitance is in the resistive state when the fourth plurality of series connected transistors are turned on.

11. The circuit of claim 10, wherein a capacitance of the switched series capacitance comprises gate-drain and gate-source capacitances of the fourth plurality of switching transistors.

12. The circuit of claim 10, wherein the first plurality of transistors is greater than the second plurality of transistors.

13. The circuit of claim 9, wherein the switched series capacitance circuit comprises a capacitor coupled in parallel with a switch.

14. The circuit of claim 8, further comprising a further switched series capacitance circuit coupled between the third RF switch and the common port, wherein the control circuit is further configured to:
place the further switched series capacitance circuit in the resistive state when providing the first RF path and when providing the third RF path; and
place the further switched series capacitance circuit in the capacitive state when providing the second RF path.

15. The circuit of claim 8, further comprising a further series RF switch coupled between a further port and the common port.

* * * * *